United States Patent [19]

Ikeda et al.

[11] Patent Number: 5,329,532
[45] Date of Patent: Jul. 12, 1994

[54] LOGIC CIRCUIT WITH ADDITIONAL CIRCUIT FOR CARRYING OUT DELAY TEST

[75] Inventors: Mitsuji Ikeda; Kazumi Hatayama, both of Katsuta; Terumine Hayashi, Hitachi, all of Japan

[73] Assignee: Hitachi, Ltd., Tokyo, Japan

[21] Appl. No.: 755,837

[22] Filed: Sep. 6, 1991

[30] Foreign Application Priority Data

Sep. 10, 1990 [JP] Japan .................................. 2-237175

[51] Int. Cl.$^5$ ............................................. H04B 17/00
[52] U.S. Cl. ............................................. 371/22.3
[58] Field of Search ................ 371/22.3, 15.1, 22.1; 324/73.1, 158 R

[56] References Cited

U.S. PATENT DOCUMENTS

| | | | |
|---|---|---|---|
| 4,669,061 | 5/1987 | Bhavsar | 365/154 |
| 4,894,830 | 1/1990 | Kawai | 371/22.3 |
| 5,006,787 | 4/1991 | Katircioglu et al. | 324/73.1 |
| 5,027,355 | 6/1991 | Stoica | 371/22.1 |
| 5,103,167 | 4/1992 | Okano et al. | 324/158 R |

Primary Examiner—Robert W. Beausoliel, Jr.
Assistant Examiner—Phung My Chung
Attorney, Agent, or Firm—Antonelli, Terry, Stout & Kraus

[57] ABSTRACT

The first and second flip-flop circuits are connected in series included within a combinational logic for carrying out a delay test. The first and second flip-flop circuits are provided with control pins, system clock pins, scan clock pins, system data pins and scan data pins, respectively. A delay time propagated from the first flip-flop circuit to the second flip-flop circuit through the path of the combinational logic to be tested is measured by detecting an input time to the first flip-flop circuit by the system clock signal to the first flip-flop circuit in response to an input signal to the control pins and a time stored in the second flip-flop circuit corresponding to output system data from the first flip-flop circuit. By measuring the delay time, whether the combinational logic is normal or abnormal is detected.

9 Claims, 9 Drawing Sheets $$\left(\begin{array}{c}x = \text{ARBITRALY VALUE}\\ d = \text{"1" OR "2"}\end{array}\right)$$

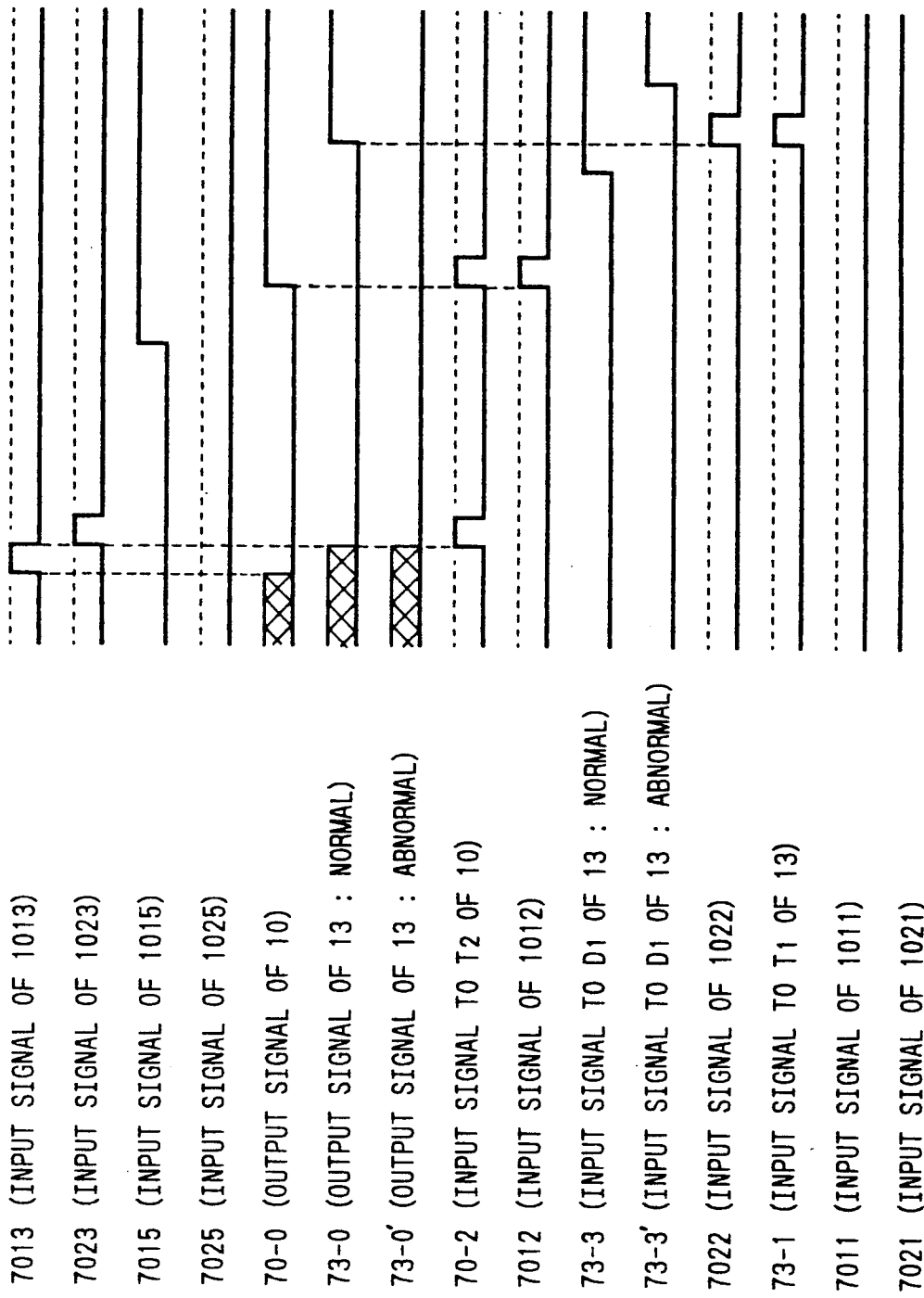

FIG. 12
| I1 | I2 | I3 | O1 | O2 |
|----|----|----|----|----|
| X  | L  | X  | L  | L  |
| L  | X  | L  | L  | L  |
| H  | H  | L  | L  | H  |
| L  | H  | H  | H  | L  |
| H  | H  | H  | (H/L OR L/H) | |
(X = ARBITRALY VALUE)
FIG. 13A
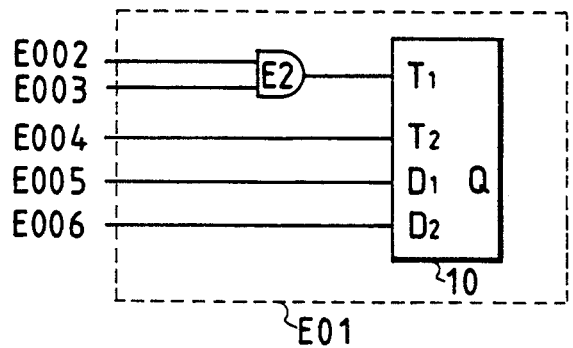
FIG. 13B
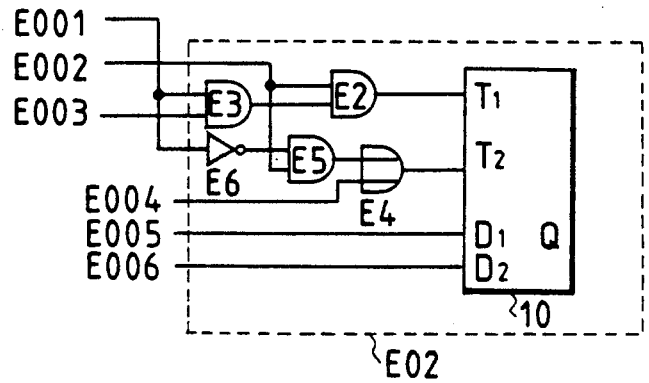

FIG. 14
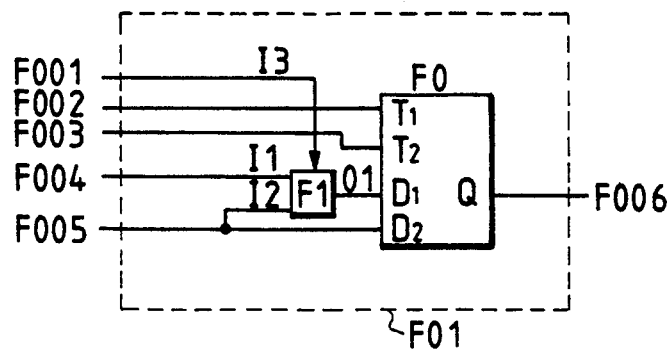
FIG. 15
| I1 | I2 | I3 | O1 |
|----|----|----|----|
| L | X | H | L |
| H | X | H | H |
| X | L | L | L |
| X | H | L | H |
(X = ARBITRALY VALUE)
FIG. 16
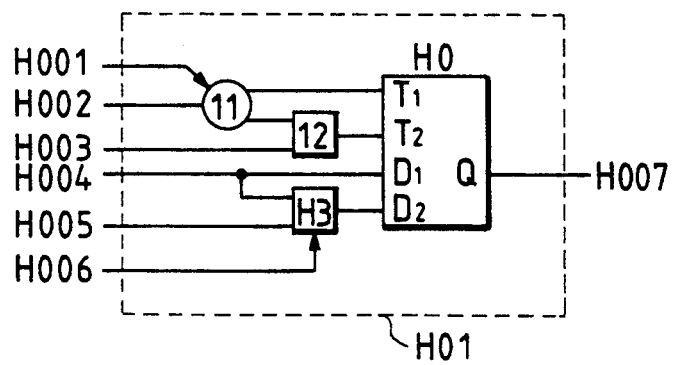

| MODE | H001 | H006 |
|------|------|------|
| J1 | H | X |
| J2 | X | H |
| J3 | L | L |
| J4 | L | H |

(X=ARBITRALY VALUE)

FIG. 19
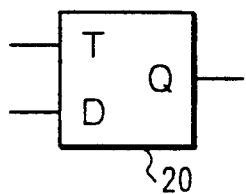
FIG. 20
| T | D | Q |
|---|---|---|
| H | d | d |
| L | X | KEEP |
d="0" OR "1"
x=ARBITRALY VALUE
FIG. 21
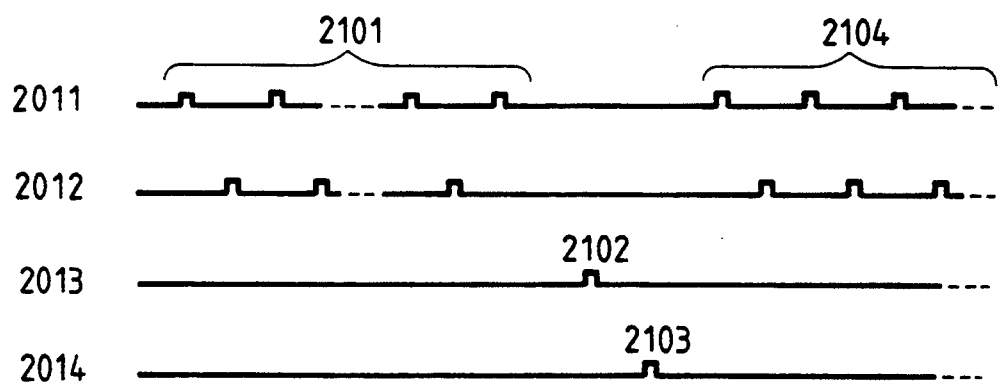

LOGIC CIRCUIT WITH ADDITIONAL CIRCUIT FOR CARRYING OUT DELAY TEST

FIELD OF THE INVENTION

The present invention relates to a logic circuit for carrying out a delay test of a combinational logic which is operated at high speed.

BACKGROUND OF THE INVENTION

Generally, a combinational logic circuit operating at high speed has an additional circuit for testing the combinational logic. The additional circuit is called a scan circuit. The scan circuit can be set to a state for testing and observing the state of the combinational logic using flip-flop circuits connected to an input terminal and an output terminal of the combinational logic.

A logic circuit for carrying out the delay test of a combinational logic is disclosed, for example, in "A logic chip delay-test method based on system timing" IBM Journal of Research and Development, Vol. 34, No. 2/3 pp. 299-313 (Mar./May 1990).

Hereunder, we will explain the above-mentioned prior art referring to FIGS. 18 to 21.

Referring to FIG. 18, 10A, 10B, 10C and 10D denote flip-flop circuits. The flip-flop circuits 10A and 10B correspond to a flip-flop circuit 10 shown in FIG. 1 mentioned later. The flip-flop circuits 10C and 10D correspond to a flip-flop circuit 13 shown in FIG. 1. The flip-flop circuits 20A, 20B, 20C and 20D are the same as flip-flop circuit 20 shown in FIG. 19. The operations of the flip-flop circuits 10A, 10B, 10C and 10D and the flip-flop circuits 20A, 20B, 20C and 20D are shown by FIG. 4 and FIG. 20, respectively. Numerals 2013 and 2014 show system clocks which are not overlapped and are used for operating an actual system. Numerals 2011 and 2012 show scan clocks. The scan clocks 2011 and 2012 are used together with a scan-in data pin 2015 and a scanout data pin 2016 for carrying out initialization and observation of these flip-flop circuits independently from a system logic. Hereunder, we will explain a procedure for carrying out a delay test of a path 2000 shown in FIG. 18 referring to the time chart shown in FIG. 21. For initializing all the flip-flop circuits and a combinational logic 200, the system clocks 2013 and 2014 are turned OFF, namely made to zero levels, at first, then the scan clocks 2011 and 2012 are alternately turned to ON states giving data to the scan-in data pin 2015 as shown in 2101 of FIG. 21 so that the data to be initialized is shifted to the flip-flop circuit in order. Next the data of the flip-flop circuits 10A, 10B, 10C and 10D are stored in the flip-flop circuits 20A, 20B, 20C and 20D by turning the scan clock to OFF state and the system clock to ON state. Thereby, a change signal 2102 is transmitted to the path 2000 for changing from level 0 to level 1 or from level 1 to level 0 of the flip-flop circuits 20A, 20B, 20C and 20D. After a transmission delay time of the path 2000 has passed, the system clock 2014 is turned to ON state as shown in 2103 of FIG. 21 so that the flip-flop circuit 10C stores the output signal of the path 2000. Then, the flip-flop circuit 10C stores different signals corresponding to normal state and abnormal state of the delay transmission time of the channel 2000. Lastly, the scan clocks 2011 and 2012 are alternately turned to ON states as shown in 2104 of FIG. 21, and the states of the flip-flop circuit 10C are shifted to the scan-out pin 2016 for observing the stored signal of the flip-flop circuit 10C.

Since the prior art mentioned above has a double latch structure of the flip-flop circuits in the input and output sides of the combinational logic which is to carry out the delay test, the transmission delay time of the path between the flip-flop circuits is longer than a single flip-flop circuit so that the performance of the circuit is lowered. Further, since the prior art can use either one of the system clock or the scan clock as a clock for the second flip-flop circuits 20A, 20B, 20C and 20D provided at both sides of the combinational logic, the additional element 21 is necessary on the clock channel compared with the circuit in which only the system clock is used. When the element is added on the clock channel, fluctuation of the clock skew is increased and power consumption is increased thereby increasing the drive performance of the clock pulse.

SUMMARY OF THE INVENTION

An object of the present invention is to provide a logic circuit which is able to perform a delay test of combinational logic at high speed or with low power consumption.

Another object of the present invention is to provide a logic circuit which is able to perform a delay test of a combinational logic, initialize flip-flop circuits connected to the combinational logic in response to the data which is independent from the logic circuit for operating a system, generate a signal change by storing data which is independent from the logic circuit for operating the system to the flip-flop circuits using the system clock, and store the system data to the flip-flop circuits using the system clock at high speed or with low power consumption.

For attaining the objects, there are two resolving methods as disclosed below.

The first resolving method is that either one of the clock input pin used for operating the system or the clock input pin used for the scanning operation is selected as the clock input pin of the flip-flop circuits, and the selected clock signal is supplied to the flip-flop circuits exclusively. A new set control pin is used for selecting either one of the clock input pins. An input signal to the control pin is designated by an address decoder corresponding to an input signal to a test mode pin, or designated corresponding to an input timing to the test mode pin. Many test pattern combinations used in the delay test can be obtained by providing a memory element immediately before the scan data input pin of the flip-flop circuits or selecting inverted data of the states of the scan data and the flip-flop circuits corresponding to the signal of the control pin so that the delay test accuracy can be enhanced.

The second resolving method is that the system data and the scan data are selected corresponding to the signal of the new set control pin as the data input to the system data input pin of the flip-flop circuits. In this case, the resolving method of the signal input to the control pin is the same as the first resolving method mentioned above.

Since the first resolving method of the present invention has no extra control concerning the data input from the system data pin, it is not necessary to provide any circuit on the channel of the system data. Accordingly, the first resolving method of the present invention can provide a high speed logical circuit in the actual operation. The first resolving method of the present invention necessitates a selecting means on the channel of the system clock. The prior art also necessitates the selecting means of the system clock or the scan clock. In this sense, the first resolving method of the present invention and the prior art are same concerning the power consumption of the system clock. Since the first flip-flop circuit connected to the input terminal of the combinational logic, which is designated an address, can be set so as to store the scan data in response to the system clock, and the second flip-flop circuit connected to the output terminal of the combinational logic can be set so as to store the system data in response to the system clock, the delay test can be carried out in such a manner that the scan data is set to the first flip-flop circuit and the system data is stored to the second flip-flop circuit. Since the system clock signal is set in a mode of storing the scan data in response to the system clock signal before the initial first system clock signal is input after the initial setting, and in a mode of storing the second system data in response to the system clock signal after the initial system clock signal is input after the initial setting, when the system clock signal is set in response to the input timing of the system clock signal, the delay test is carried out in such a manner that the scan data is stored in the first flip-flop circuit and the system data is stored in the second flip-flop circuit.

Since the second resolving method of the present invention has no extra control to the actual operation clock signal, it is not necessary to provide any circuit on the channel of the system clock. Accordingly, the second resolving method of the present invention can reduce its power consumption which is necessary for providing the system clock signal compared with the prior art. The second resolving method of the present invention necessitates a selecting means on the channel of the system data. The prior art necessitates two flip-flop circuits at the first and second flip-flop circuits, respectively, as explained before. In this sense, the second resolving method of the present invention is same as the prior art in the actual response operating time. Since the second resolving method of the present invention can select the system data or the scan data as the data which is stored in the flip-flop circuits in response to the system clock based on the signal to the control pin, the delay test can be carried out in such a manner that the scan data is stored in the first flip-flop circuit and the system data is stored in the second flip-flop circuit.

BRIEF DESCRIPTION OF THE DRAWINGS

FIG. 5 shows a timing chart for explaining the delay test carried out in accordance with FIG. 1;

FIG. 12 is a diagram for explaining the operation of the first and second flip-flop circuit shown in FIG. 11;

FIG. 13B is a diagram showing the first and second flip-flop circuits with additional circuits to the flip-flop circuit shown in FIG. 13A which are applied to the first resolving method of the present invention;

FIG. 14 shows a diagram of the first and second flip-flop circuits with additional circuit which are applied to the second resolving method of the present invention;

FIG. 15 is a diagram for explaining the operation of the first and second flip-flop circuits shown in FIG. 14;

FIG. 16 shows a diagram of the first and second flip-flop circuits with additional circuits which are applied to the first resolving method of the present invention;

FIG. 19 shows a diagram of the flip-flop circuits 20A, 20B, 20C and 20D shown in FIG. 18;

FIG. 20 is a diagram for explaining the operation of the flip-flop circuits shown in FIG. 19; and FIG. 21 shows a timing chart for explaining the delay test carried out in accordance with FIG. 20.

DETAILED DESCRIPTION OF THE PREFERRED EMBODIMENTS

Figure 1:
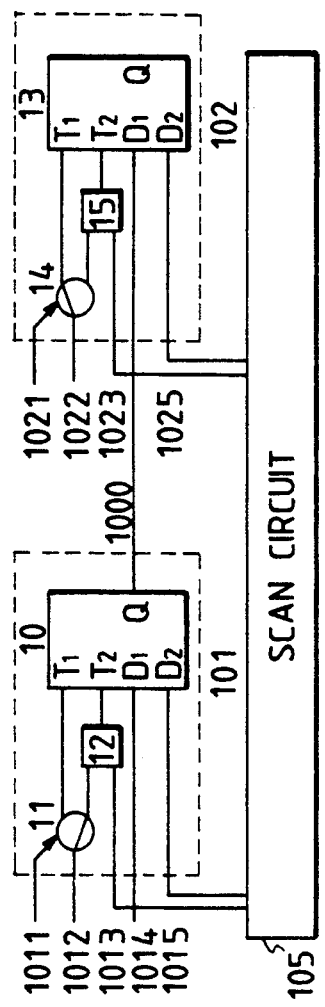
FIG. 1 shows a block diagram of the first embodiment of the present invention, in which the first resolving method takes place.

Referring to FIG. 1, the first flip-flop circuit 10 is connected to the second flip-flop circuit 13 through a combinational logic (not shown). A path 1000 connected between the first flip-flop circuit 10 and the second flip-flop circuit 13 is a region of the combinational logic in which the delay test is to be carried out. The flip-flop circuits 10 and 13 are provided a clock pin T1 and a data pin D1 of the system, a clock pin T2 and a data pin D2 used for testing, and an output pin Q, respectively. Switch circuits 11 and 14 for turning input signals to either the pin T1 or the pin T2 based on switch control signals 1011 and 1021 and multiplexers 12 and 15 are connected to the flip-flop circuits 10 and 13, respectively. The switch circuit 11, the multiplexer 12 and the flip-flop circuit 10 constitute a flip-flop circuit 101 with an additional circuit. The switch circuit 14, the multiplexer 15 and the flip-flop circuit 13 constitute a flip-flop circuit 102 with an additional circuit. The flip-flop circuits 101 and 102 with the additional circuits are input with the switch control signals 1011 and 1021, system clocks 1012 and 1022, scan clocks 1013 and 1023 and scan data 1015 and 1025, respectively. The flip-flop circuit 101 with the additional circuit is further provided system data 1014.

Figure 2:
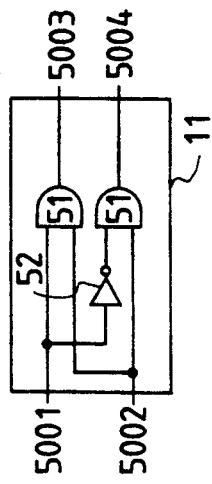
FIG. 2 shows one example diagram of a switching circuit shown in FIG. 1.

Referring to FIG. 2, the switch circuit 11, as well as 14, has AND gates 51 and 52 and NOT gate 52. The switch control signal 1011 is input to a control pin 5001. The system clock 1012 is input to a clock input pin 5002.

The first output pin 5003 is connected to the pin T1 of the flip-flop circuit 10 or 13. The second output pin 5004 is connected to an input pin 6001 shown in FIG. 3.

Figure 3:
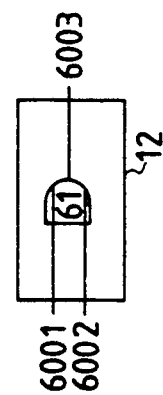
FIG. 3 shows one example diagram of a multiplexer shown in FIG. 1.

Referring to FIG. 3, the multiplexer 12, as well as 15, has an OR gate 61. An input pin 6002 feeds the scan clock 1013. An output pin 6003 is connected to the pin T2 of either the flip-flop circuit 10 or 13, respectively.

Figure 4:
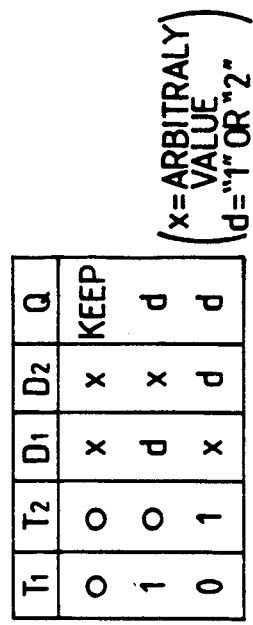
FIG. 4 is a diagram for explaining the operation of the first and second flip-flop circuits shown in FIG. 1.

Referring to FIG. 4, the flip-flop circuits 10 and 13 are operated in such a manner that the data D1 is stored when the clock T1 is 1, the data D2 is stored when the clock T2 is 1, and the previous data is kept when the clocks T1 and T2 are 0.

The flip-flop circuits 10 and 13 are provided the system clock pins T1 and the system data pins D1 which are connected to an actual operating logic circuit (not shown), and the scan clock pins T2 and the scan data pins D2 which are connected to a scan circuit 105. The flip-flop circuits 10 and 13 store, in system operation, the system data 1014 and 1000 input to the system data pin D1 based on the system clock signals 1012 and 1022 input to the system clock pins T1, respectively and store the scan data 1015 and 1025 input to the scan data pins D2 based on the scan clock signals 1013 and 1023 input to the scan clock pins T2, respectively.

The system clock 1012 and 1022 are input to the scan clock pin T2 through the switch circuits 11 and 14 and the multiplexers 12 and 15, respectively. Accordingly, the scan data 1015 and 1025 can be stored in the flip-flop circuits 10 and 13 in response to the system clocks 1012 and 1022, respectively.

Hereunder, we will explain the operation of the delay test carried out through the path 1000 referring to FIG. 5.

(1) The flip-flop circuits 10 and 13 are initialized using the scan clocks 1013 and 1023 and the scan data 1015 and 1025 as shown by 7013, 7023, 7015, 7025, 70-0 and 73-0.

(2) For storing the scan data 1015 in the flip-flop circuit 10 by the system clock 1012 and storing the system data 1014 in the flip-flop circuit 13 by the system clock 1022, the control signal 1011 is turned OFF, the control signal 1021 is turned ON, the system clock 1012 is input to the multiplexer 12 and the system clock 1022 is input to the T1 pin of the flip-flop circuit 13 as shown by 7011 and 7021.

(3) When a rise signal is intended to be input to the channel 1000, the flip-flop circuit 10 is set to "0" level in the initial setting. After that, the scan data 1015 is changed to "1" level and the system clock 1012 is applied as shown by 7015, 7012, 70-2 and 70-0.

On the other hand, when a fall signal is intended to be input to the path 1000, the flip-flop circuit 10 is set to "1" level in the initial setting. After that the scan data 1015 is changed to "0" level and the system clock 1012 is applied.

(4) The measurement of abnormality concerning the propagation delay time of the path 1000 takes place whereby the output signal of the flip-flop circuit 10 is changed, the maximum value of the propagation delay time of the path 1000, which is identified by the specification, is passed, and the system clock 1022 is input to the flip-flop circuit 13 so as to store the signal input to the system data pin D1 of the flip-flop circuit 13 as shown by 7022.

(5) When there is no abnormality of the propagation delay of the path 1000, the flip-flop circuit 13 stores the signal shown by 73-3 and 73-0.

(6) On the other hand, when there is abnormality of the propagation delay of the path 1000, the input signal from the output pin Q of the flip-flop circuit 10 to the pin D1 of the flip-flop circuit 13 does not reach the flip-flop circuit 13 within the lapse of the maximum value of the propagation delay time of the path 1000 mentioned in item (4) so that the flip-flop circuit 13 stores the previous signal at the time when the system clock signal 1022 is input as shown by 73-3' and 73-0'.

According to the embodiment of the present invention, the input signals 7012 and 7022 are given corresponding to the system clocks 1012 and 1022, and whether the flip-flop circuit 13 inputs the signal 73-3 within a predetermined time decided by the system clock is tested, so that the logic circuit shown in FIG. 1 can perform a highly accurate delay test of the path 1000 of the combinational logic. The logic circuit shown in FIG. 1 has the advantage that the system data is not delayed at the propagation time, since any extra circuit is not necessary at the system data propagation line between the scan circuit 105 and the flip-flop circuits 10 and 13.

The first embodiment shown in FIG. 1 shows the fundamental portion of the present invention. Hereunder, we will explain the logic circuit which includes a circuit for supplying other control signal or data.

Figure 6:
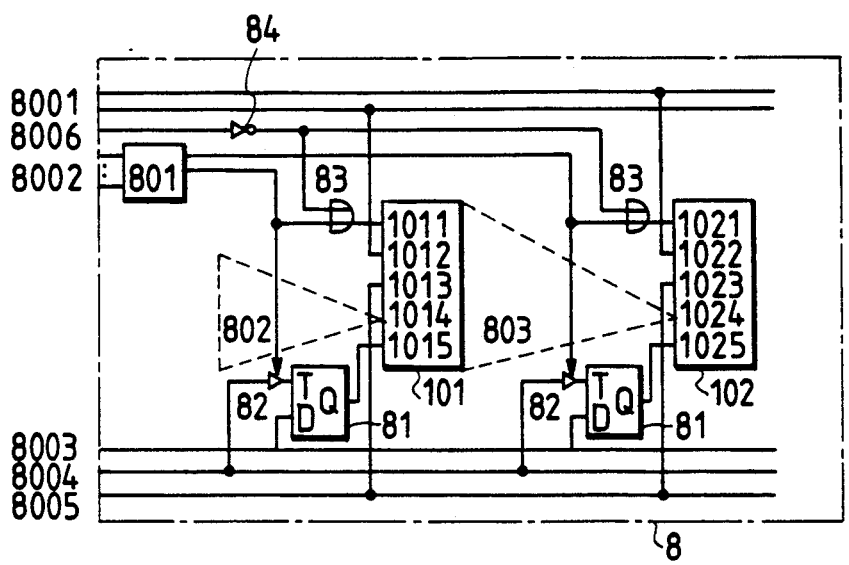
FIG. 6 shows a block diagram of the second embodiment of the present invention, in which the first and second resolving methods take place.

Referring to FIG. 6, the logic circuit 8 fundamentally comprises the first flip-flop circuit 101, the combinational logic 803 connected to the output pin of the flip-flop circuit 101 and the second flip-flop circuit 102 to which the path of the combinational logic 803 to be tested is connected. System clock 8001 is connected to the system clock terminals 1012 and 1022 of the flip-flop circuits 101 and 102, respectively. A test mode pin 8006 is connected to a NOT gate 84. The NOT gate 84 is connected to OR gates 83. The address data 8002 is input to an address decoder 801. The address decoder 801 is connected to the OR gates 83. The outputs of the NOT gate and the address decoder 801 are inputted to the switch control signal terminal 1011 of the flip-flop circuit 101, 1021 of the flip-flop circuit 102, and so on. The scan data 8003 is input to D terminals of D flip-flop circuits 81. The scan clock 8004 and the output of the address decoder 801 are input to T terminals of the D flip-flop circuits 81 through AND gates 82. The scan clock 8005 is input to the scan clock terminals 1013 and 1023 of the flip-flop circuits 101 and 102, respectively. A combinational logic 802 is connected to the system data terminal 1014 of the flip-flop circuit 101.

The second embodiment shown in FIG. 6 is an example of the logic circuit 8 in which the control signal of the switch circuit and the scan data stored by the scan clock 8004 are set to the flip-flop circuits using the address decoder 801 to which the address data 8002 are input.

The logic circuit 8 is provided the D flip-flop circuits 81 for supplying the data used for the testing of circuits than the flip-flop circuits 101 and 102. The test mode pin 8006 is set to "1", when the delay test is carried out. The test mode pin 8006 is set to "0", when the actual operation of the combinational logic takes place.

When the scan mode of the logic circuit 8, namely the initializing mode of each flip-flop circuit used for testing, takes place, the value to the D flip-flop circuit 81 connected to the scan data pin of each flip-flop circuit is set using the address decoder 801, the scan clock 8004 and the scan data 8003. After that, the initial setting of each flip-flop circuit takes place using the scan clock 8005.

The delay test of an arbitrary path within the combinational logic 803 takes place in such a manner that the value designated by the address decoder 801 is set to the D flip-flop circuit 81 connected to the scan data pin of each flip-flop circuits which necessitate the state changes using the address decoder 801, the scan clock 8004 and the scan data 8003, and the control signal of the flip-flop circuit 102 is turned ON using the address decoder 801.

Since the logic circuit 8 shown in FIG. 6 can use the address decoder 801 for carrying out the delay test, the logic circuit 8 has a merit in that the additional circuit on the system data lines is eliminated.

Figure 7:
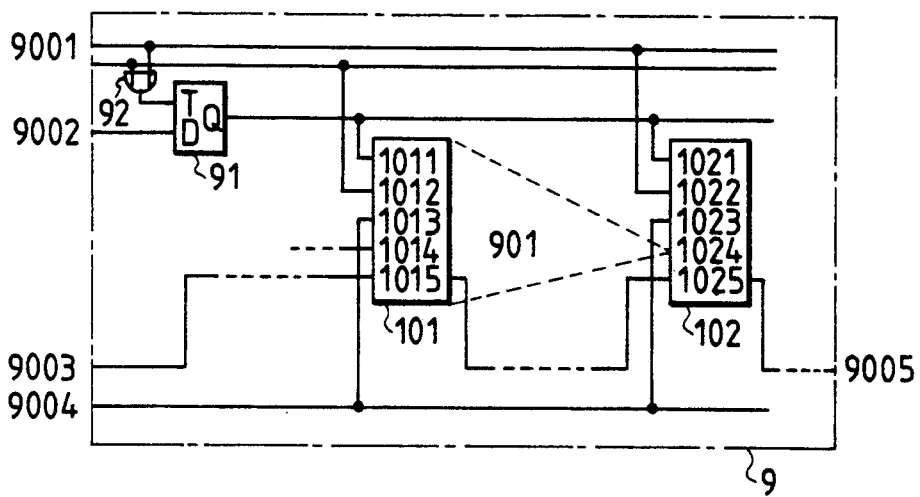
FIG. 7 shows a block diagram of the third embodiment of the present invention, in which the first and second resolving methods take place.

Referring to FIG. 7, the logic circuit 9 mainly comprises the first and second flip-flop circuits 101 and 102 and the combinational logic 901 as well, as seen in FIG. 1. The system clocks 9001 are input to an OR gate 92 and the system clock terminals of the flip-flop circuits 101 and 102. The output signal of the OR gate 92 is input to the pin T of the D flip-flop circuit 91. The test control data 9002 is input to the pin D of the flip-flop circuit 91. The pin Q of the flip-flop circuit 91 is connected to the switch control signal terminals 1011 and 1021 of the flip-flop circuits 101 and 102. The combinational logic 901 is connected between the two flip-flop circuits 101 and 102. The scan input data 9003 is input to the scan data terminal 1015 of the flip-flop circuit 101. The scan clock 9004 is input to the scan clock terminals 1013 and 1023 of the flip-flop circuits 101 and 102. The scan output data 9005 is output from the logic circuit 9.

The third embodiment shown in FIG. 7 shows an example in which an address decoder is not used. The logic circuit 9 shown in FIG. 7 is different from the logic circuit shown in FIG. 6 in that the D flip-flop circuit 91 is provided for storing the data of the test control data 9002 in response to arbitrary system clock, and the output signal of the D flip-flop circuit 91 is provided to other flip-flop circuits 101 and 102.

The delay test of the path within the combinational logic 901 is carried out as follows.

The D flip-flop circuit 91 is initialized to be "0" level using the system clock 9001 in such a manner that the flip-flop circuits 101 and 102 other than the D flip-flop circuit 91 store the scan data 9003 in response to the system clock 9001.

Next, the flip-flop circuits 101 and 102 are initialized using the scan input data 9003 and the scan clock 9004. After that "1" level signal is input to the D input pin of the D flip-flop circuit 91. The system clock 9001 is applied to the flip-flop circuit 101 for determining the timing of the system clock 7012 and 7022 shown in FIG. 5.

In response to the system clock 9001 mentioned above, the output signal of the D flip-flop circuit 91 is inverted from "0" level to "1" level so that the flip-flop circuits 101 and 102, except the D flip-flop circuit 91, are changed to the state that the flip-flop circuits 101 and 102 store the system data in response to the system clocks 9001.

Abnormality of the tested path of the combinational logic is detected by applying the clock pulse to the flip-flop circuit 102 in the manner disclosed by FIG. 5.

The advantage of the third embodiment shown by FIG. 7 resides in that additional circuits such as an address decoder are not necessary. However, the logic circuit 9 is demanded to design the circuit so that the switch control signal reaches to the switch gate of each flip-flop circuit faster than the propagation delay time of the paths.

Incidentally, the logic circuit 9 shown in FIG. 7 is set such that the D flip-flop circuit 91 and the test control data pin 9002 are "0" level during normal operation time.

The third embodiment of the present invention can modify the scanning method. For example, the random access scan method shown in FIG. 6 is applied to the third embodiment instead of the shift scan method shown in FIG. 7. In the case of FIG. 6, many paths can be tested, since there is no restriction of transition of the flip-flop circuits 101 and 102, and the number of available test patterns of the combinational logic 10 is increased.

Figure 8:
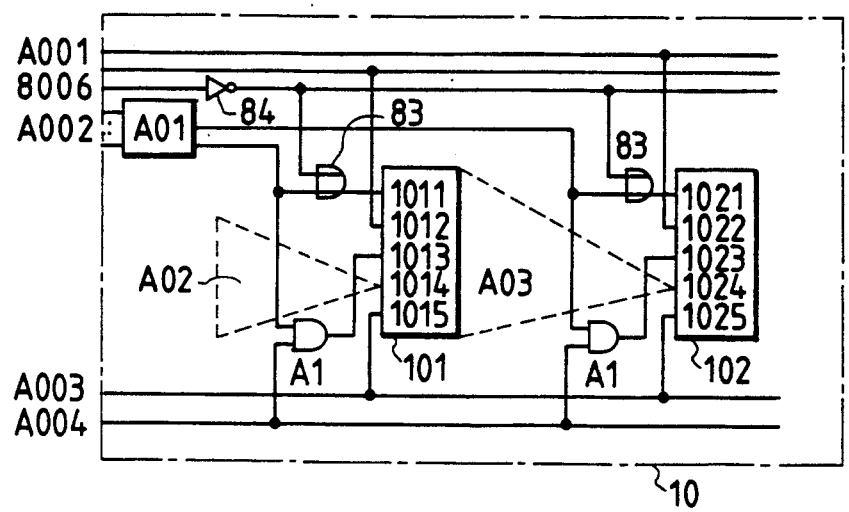
FIG. 8 shows a block diagram of the fourth embodiment of the present invention, in which the first resolving method takes place.

Referring to FIG. 8, the logic circuit 10 is constituted by removing the scan clock 8005 and the D flip-flop circuits 81 from the embodiment shown in FIG. 6, connecting the output pin of the AND gates A1 to the scan clock terminals 1013 and 1023 of the flip-flop circuits 101 and 102, and connecting the scan data A003 to the scan data terminals 1015 and 1025 of the flip-flop circuits 101 and 102. A001, A002 and A004 denote the system clock, the address data and the scan clock, respectively. The number of test patterns of the logic circuit 10 are less than that of the logic circuit 8 shown in FIG. 6. By the logic circuit 10, the number of the additional circuit can be decreased compared with the logic circuit 6.

The delay test of the logic circuit 10 is carried by the following procedures.

At first, each flip-flop circuit is designated by the address decoder A01 connected to the address data A002, and initialized by the scan clock A004 and the scan data A003.

Next, the inverted initial value of the flip-flop circuit 101 is set to the scan data A003, and the changed signal 7012 is produced by inputting the system clock A001 to the flip-flop circuits 101 and 102.

Since the flip-flop circuit 102 is designated the address, the changed signal output from the combinational logic A03 is stored in the flip-flop circuit 102.

Lastly, the tested data is output by scanning out the state of the flip-flop circuit 102 so that the delay test is completed.

There is an occasion that the logic circuit 10 can not monitor the propagation of a fault information, since some flip-flop circuits, which are not designated an address, store the same scan data as the other flip-flop circuit 101 in response to the system clock A001.

Figure 9:
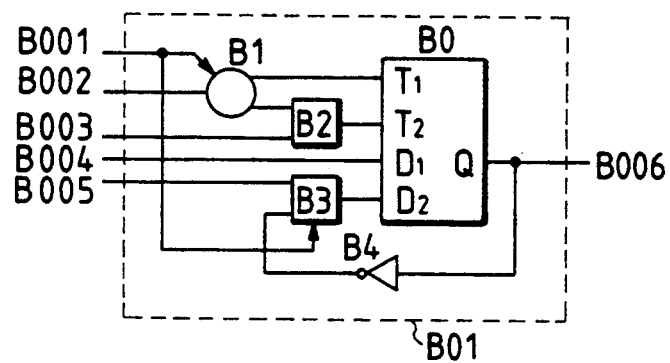
FIG. 9 shows a diagram of the first and second flip-flop circuits in which the first resolving method takes place.

For avoiding this defect, it is recommended to use flip-flop circuits B01 shown in FIG. 9 as the logic circuit with the additional circuits.

The flip-flop circuit B01 outputs the scan data B005 through the selector circuit B3 when the control signal B001 is turned ON, and outputs the reversed output value of the flip-flop circuit B0 as the output data B006 when the control signal B001 is turned OFF. B002, B003, B004 B1, B2 and B4 denote the system clock, the scan clock, the system data, the switch circuit, the multiplexer and the NOT gate, respectively.

When the flip-flop circuits B01 with the additional circuits are used as the flip-flop circuits 101 and 102 shown in FIG. 8, the initialization can be done correctly to the flip-flop circuit which is not designated the address so as not to prevent the fault propagation of the information through the logic circuit 10, since the system clock is input to the T2 pin and the inverted output signal from the Q pin is input to the D2 pin. Since the initialization of the flip-flop circuits can be set directly and the fault information is propagation through the logic circuit B01, many paths can be tested correctly.

Figure 10:
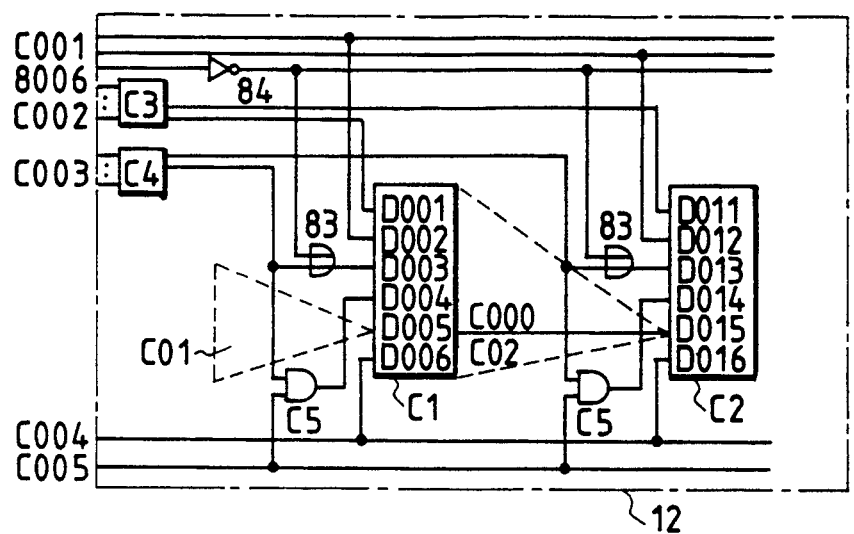
FIG. 10 shows a block diagram of the fifth embodiment of the present invention, in which the first and second resolving methods take place.

Referring to the fifth embodiment shown by FIG. 10, D flip-flop circuits are omitted as well as the logic circuit 10 of the fourth embodiment shown by FIG. 8, and address decoders C3 and C4 are provided instead. The logic circuit 12 can attain the same effects as those shown by FIG. 8. In FIG. 10, C1 and C2 denote the flip-flop circuits with the additional circuits. C5 denotes AND gates. C01 and C02 denote the combinational logic. C000 and C001 denote the path to be tested and the system clock, respectively. C002 and C003 denote the address data. C004 and C005 denote the scan data and the scan clock, respectively.

Figure 11:
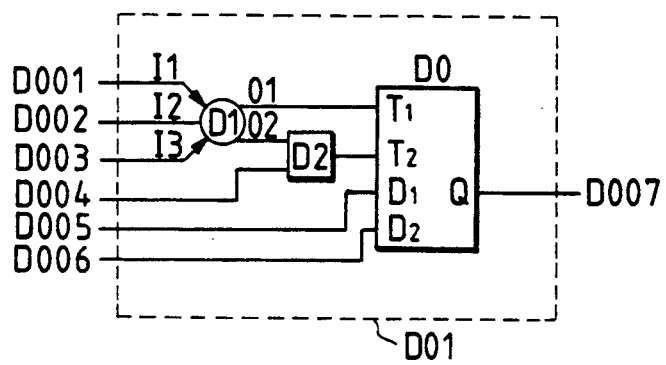
FIG. 11 shows a diagram of the first and second flip-flop circuits applied to FIG. 10.

As shown in D01 of FIG. 11, the flip-flop circuits C1 and C2 used in the logic circuit 12 store the scan data D006 to the flip-flop circuit D0 through the data pin D2 in response to the system clock D002 when the address designation D001 is at level "1", stores the system data D005 to the flip-flop circuit D0 through the data pin D1 in response to the system clock D002 when the address designation D003 is at level "1", and suppresses the input of the system clock when the address designations D001 and D003 are at level "0". D004, D1, D2 and D007 denote the scan clock, the switch circuit, the multiplexer and the output data, respectively.

The switch circuit D1 which is added to the flip-flop circuit shown in FIG. 11 is operated according to a truth value shown by FIG. 12.

The delay test of the path C000 to be tested in the logic circuit 12 shown by FIG. 10, is carried out in such a manner that each flip-flop circuit is initialized using the scan circuits C004, C005 and C5, the flip-flop circuits C1 and C2 are addressed by the address data C002 and C003, and the inverted value of the flip-flop circuit C1 is set by the scan data C004.

When the address designation 1 of the flip-flop circuit C1 is at level "1", the flip-flop circuit stores the scan data C004 in accordance with the system clock C001, and the changed signal from the flip-flop circuit C1 caused by the scan data C004 is input to the test path C000. When the address designation 2 of the flip-flop channel C2 is at level "1", the flip-flop channel C2 stores the output signal of the path C000 in accordance with the system clock C001. Thereby, the delay test is realized. C005 and C5 designate the scan clock and the AND gate, respectively. C01 and C02 are combinational logic.

As one method for reducing the number of the additional circuits, the control signal can be directly input to a gate used for the actual operation.

Referring to FIGS. 13A and 13B, when the system clock input E002 of the flip-flop circuit 10 is controlled by the clock control signal E003, the flip-flop circuit 10 can be modified to realize the same function as the flip-flop circuit 101 shown in FIG. 1 without adding any circuits on the path of the system clock E002 and the path of the system data E005. FIG. 13A denotes the flip-flop circuit E01 in which the system clock input T1 of the flip-flop circuit 10 is input by a logical add of the system clock signal line E002 and the system clock control signal line E003. FIG. 13B denotes the flip-flop circuit E02 in which the system clock E002 is input to the system clock input pin T1 of the flip-flop circuit 10 through the AND gate E2 and the scan clock input pin T2 through the AND gate E5 and the OR gate E4 corresponding to the control signal E001. The element, namely AND gate E2, on the path from the system clock input pin T1 of the flip-flop circuit E02 to the system clock signal line E002, and the element on the path from the system data input pin D1 to the system data signal line E005 are the same as that of the flip-flop circuit E01. Accordingly, the high responsiveness of the system operation of the flip-flop circuit E02 is the same as that of the flip-flop circuit E01. E6, E003, E004 and E006 denote the NOT gate, the system clock control input, the scan clock and the scan data, respectively.

Referring to the flip-flop circuit F01 shown in FIG. 14, the system data is input to the system data input pin D1 of the flip-flop F0 when the control signal F001 is turned ON, and the scan data is input to the system data input pin D1 of the flip-flop F0 when the control signal F001 is turned OFF. The operation of the flip-flop shown in FIG. 14 takes place according to the truth value shown by FIG. 15. F002, F003, F004, F005, F006, F1 and F01 denote the system clock, the scan clock, the system data, the scan data, the output data, the selector circuit and the flip-flop circuit with the additional circuits, respectively.

The feature of the flip-flop circuit F0 is that the additional circuits do not exist on the system clock path.

The logic circuit using the flip-flop circuit F0 shown in FIG. 14 carries out its test as well as each embodiment mentioned above.

The flip-flop circuit H01 shown in FIG. 16 can apply to the fifth embodiment mentioned before.

Figures 17, 18:
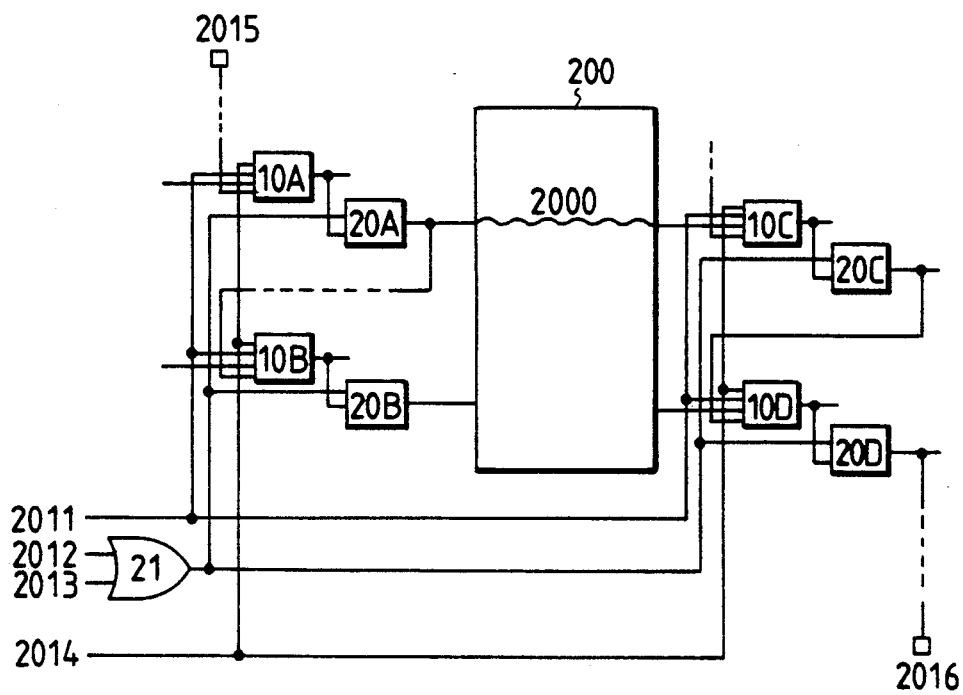
FIG. 17 is a diagram for explaining the operation of the first and second flip-flop circuits shown in FIG. 16.
FIG. 18 shows a block diagram of the prior art relating to the present invention.

The flip-flop circuit H01 carries out the operation of storing the system data by the system clock H002 in accordance with the input signal to the pin D2 used for scanning the flip-flop circuit, and the operation of storing the scan data H005 by the system clock in accordance with the input signal to the pin D2 used for scanning. The flip-flop H0 is operated as shown by FIG. 17. In FIG. 16, H001, H003, H004, H006, H007, H0, H01, 11, 12 and H3 denote the control signal, the scan clock, the system data, the control signal, the output data, the flip-flop, the flip-flop circuit with the additional circuits, the switch circuit, the multiplexer and the selector circuit, respectively. In FIG. 17, J1, J2, J3 and J4 denote the system mode, the scan mode, the delay test mode 1 in which the system data is input by the system clock and the delay test mode 2 in which the scan data is input by the system clock, respectively.

Further, there is another flip-flop in which the operation of storing the system data by the system clock 7 is carried out by the pin used for scanning the flip-flop, and the operation of storing the scan data by the system clock is carried out by the pin used for the system.

The flip-flop circuit shown in FIG. 16 has an advantage that the additional circuits do not exist on the system data path as in the flip-flop circuit 101 shown in FIG. 1 and the flip-flop circuit B01 shown in FIG. 9.

The delay test of the logic circuit having the flip-flop circuits shown in FIG. 16 is the same as that the control signal H001 of each flip-flop circuit is connected to the test mode pin which is "1" in the normal operation and "0" in testing, and the control signal H006 is regarded as same as the control signal D003 of the flip-flop circuit D01.

According to the present invention mentioned above, the changed signal is produced in the first flip-flop circuit output to the combinational logic using the system clock and the changed signal is stored in the second flip-flop circuit input from the combinational logic using the system clock for carrying out the delay test of the channel of the combinational logic. Accordingly, the present invention provides the logic circuit for carrying out the delay test without many procedures for producing the test patterns, and the delay test method having high accuracy.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What we claim is:

1. A logic circuit comprising:
   a combination logic for executing at least one predetermined logical function, wherein said combinational logic includes first and second flip-flop circuits connected in series;
   wherein said first and second flip-flop circuits comprise:
   a system data input pin for inputting a system data,
   a first clock input pin for inputting a first clock signal which causes said system data to be stored in a respective one of said first and second flip-flops;
   a scan data input pin for inputting a scan data,
   a second clock input pin for inputting a second clock signal which causes said scan data to be stored in a respective one of said first and second flip-flops,
   first switching means for selecting, in response to a first control signal given to a first control input pin thereof, a destination of a system clock signal for said first flip-flop circuit by switching between said first clock input pin and said second clock input pin of said first flip-flop circuit,
   second switching means for selecting, in response to a second control signal given to a first control input pin thereof, a destination of a system clock signal for said second flip-flop circuit by switching between said first clock input pin and said second clock input pin of said second flip-flop circuit,
   means for generating said first control signal to be given to said first control input pin of said first switching means for effecting said scan data to be input through said scan data input pin of said first flip-flop circuit therein, in response to said system clock signal for said first flip-flop circuit, and
   means for generating said second control signal to be given to said first control input pin of said second switching means for effecting output data of said combination logic to be entered through said system data input pin of said second flip-flop circuit therein, in response to said system clock signal for said second flip-flop circuit.

2. A logic circuit according to claim 1, wherein said first and second flip-flop circuits further comprises, respectively, means for inputting said scan data to said scan input pin when said control signals are is turned ON and for inputting reversed signals of said flip-flop circuits to said scan input pin when said control signals are turned OFF.

3. A logic circuit according to claim 1, further comprising means for supplying different signals to said control pin of said first flip-flop circuit and said control pin of said second flip-flop circuit.

4. A logic circuit according to claim 1, wherein said first and second flip-flop circuits have a D flip-flop circuit for storing a data from an arbitrary system clock and outputting the data to said control pin, respectively.

5. A logic circuit according to claim 1, further comprising:
   an address decoder for inputting said control signal to said control pin.

6. A logic circuit comprising:
   a combinational logic for executing at least one predetermined logical function, wherein said combinational logic includes first and second flip-flop circuits connected in series;
   wherein said first and second flip-flop circuits comprise:
   a system clock input pin for inputting a system clock signal,
   a first data input pin through which a data appearing at said first data input pin is stored in a respective one of said first and second flip-flop circuits in response to said system clock signal,
   a scan clock input pin for inputting a scan clock signal,
   a scan data input pin through which a scan data is stored in a respective one of said first and second flip-flop circuits in response to said scan clock signal,
   first selecting means for selectively inputting either one of a system data and said scan data through said first data input pin into said first flip-flop circuit in response to a control signal at a first control input pin of said first selecting means,
   second selecting means for selectively inputting either one of a system data and said scan data through said first data input pin into said second flip-flop circuit in response to a control signal at a second control input pin of said second selecting means,
   means for generating said first control signal to be given to said control input pin of said first selecting means for enabling said scan data to be entered through said first data input pin into said first flip-flop circuit in response to said system clock signal for said first flip-flop circuit, and
   means for generating said second control signal to be given to said control input pin of said second selecting means for enabling an output data of said combinational logic to be entered through said first data input pin into said second flip-flop circuit in response to said system clock signal for said second flip-flop circuit.

7. A logic circuit according to claim 6, further comprising means for supplying different signals to said control pin of said first flip-flop circuit and said control pin of said second flip-flop circuit.

8. A logic circuit according to claim 6, wherein said first and second flip-flop circuits have a D flip-flop circuit for storing a data from an arbitrary system clock and outputting the data to said control pin, respectively.

9. A logic circuit according to claim 6, further comprising:
   an address decoder for inputting said control signal to said control pin.

* * * * *